US008654527B2

(12) United States Patent
Wei et al.

(10) Patent No.: US 8,654,527 B2
(45) Date of Patent: Feb. 18, 2014

(54) THYRISTOR VALVE MODULE (76) Inventors: Xiaoguang Wei, Beijing (CN); Guangfu Tang, Beijing (CN); Jialiang Wen, Beijing (CN); Sheng Zhang, Beijing (CN)

(*) Notice: Subject to any disclaimer, the term of this patent is extended or adjusted under 35 U.S.C. 154(b) by 967 days.

(21) Appl. No.: 12/679,302

(22) PCT Filed: Dec. 18, 2009

(86) PCT No.: PCT/CN2009/001506
§ 371 (c)(1),
(2), (4) Date: Mar. 19, 2010

(87) PCT Pub. No.: WO2011/072432
PCT Pub. Date: Jun. 23, 2011

(65) Prior Publication Data
US 2011/0272042 A1 Nov. 10, 2011

(30) Foreign Application Priority Data
Dec. 14, 2009 (CN) .......................... 2009 1 0242359

(51) Int. Cl.
*H01L 23/473* (2006.01)
(52) U.S. Cl.
USPC ........... 361/688; 361/820; 361/807; 361/830; 257/714; 363/132

(58) Field of Classification Search
USPC ......... 361/658, 688, 707, 809, 810, 820, 825, 361/830, 831
See application file for complete search history.

(56) References Cited

U.S. PATENT DOCUMENTS

| 4,178,630 | A | * | 12/1979 | Olsson | 363/141 |
| 4,675,720 | A | * | 6/1987 | Ikegame et al. | 257/714 |
| 5,045,924 | A | * | 9/1991 | Ikegame | 257/721 |
| 5,815,385 | A | * | 9/1998 | Hyttinen et al. | 363/34 |
| 6,867,970 | B2 | * | 3/2005 | Muller et al. | 361/695 |
| 2003/0235026 | A1 | * | 12/2003 | Anheuer et al. | 361/602 |
| 2009/0284922 | A1 | * | 11/2009 | Wang et al. | 361/699 |

\* cited by examiner

*Primary Examiner* — Adolf Berhane
*Assistant Examiner* — Gustavo Rosario Benitez
(74) *Attorney, Agent, or Firm* — Sentry patent P.C.

(57) ABSTRACT

This present invention provides a high power electronic device which is used for transforming the alternating current into the direct current, or transforming the direct current into the alternating current: a thyristor valve module, there are two same thyristor valve segments in the whole thyristor valve module; each segment includes saturated reactor, thyristor valve unit, direct current equalizing resistor unit, acquiring energy unit, damped resistor unit, damped capacitor unit, gate series unit and water cooling system. This device series connects the thyristor valves to meet different transmission powers and different voltage ranks. This device is the key element of the high voltage direct current transmission. It can be used for different voltage ranks AD transmission system and can also be used for different voltage ranks DC system, including the ultra-high voltage 800 kV and above system.

8 Claims, 9 Drawing Sheets

THYRISTOR VALVE MODULE

RELATED APPLICATIONS

This Application is a United States National Stage Application filed under 35 U.S.C. §371 of PCT patent application Serial No. PCT/CN2009/001506 filed on Dec. 18, 2009, which claims the benefit of Chinese Patent Application Serial No. 200910242359.9 filed on Dec. 14, 2009, the disclosures of all of which are hereby incorporated by reference in their entirety.

FIELD OF THE INVENTION

The present invention relates to the high power electronic converter valve of the power system field, and particularly relates to a novel thyristor valve module used for high voltage direct current transmission.

BACKGROUND OF THE INVENTION

Thyristor valve is the key element of the high voltage direct current transmission. Its development and application has many years history. The traditional HVDC thyristor valve module is centered as the series connection thyristor valves structure; furthermore it also has the control system, trigging system and the protection system. Considering the safety of the thyristor valve, the module also includes the following auxiliary elements: saturated reactor, thyristor valve unit, damped resistor unit, damped capacitor unit, direct current equalizing resistance, acquiring energy resistance, control unit of thyristor valves, trigging unit of thyristor valves, protection unit of thyristor valves and water cooling system to meet the requirement. According to the rank of thyristor valves and the requirement to transmission power, choose suitable category. These elements, control units and water cooling system are effectively integrated together to form a thyristor valve module.

At present, the operation thyristor valves have some problems and disadvantages, such as easy leakage, high weight, and large structural size, difficult to install and repair. Leakage is the most key factor to affect the thyristor valves operation safely. And the weight and the structure are related with the manufacture cost, the convenience of the installation and the repair. The installation and repair are related with the operability and work efficiency of the engineering application.

Now there are mainly two forms about the thyristor valves structure design, frame structure and module distributed structure design. For frame structure design, there are two compositions, metallic frame structure and metallic composition and large size insulated beam mixture frame structure. Frame is the support of the valves module; there are various elements in the frame. For the metallic frame structure, the support strength is great, but the insulation problem of the air with metal is worth considering on high voltage condition. This will increase the size and the weight of the module frame, and waste the inner module space. For the mixture frame structure, there are mechanical strength problems. Because the module frame needs to take great weight load, it needs higher the structural strength of the insulated channel/beam, such as higher tensile strength, higher bending strength and higher shearing strength. This will increase module design difficulty and manufacture cost, and hamper the engineering application. For module distributed structure design, the inner elements of the module, such as thyristor valves, damped resistors, damped capacitors, gate series units, saturated reactors and so on, are all modular assembled. There are too much distributed valve modules in this structure design. This will increase the project site assembled difficulty; it is also harmful to improve the installation efficiency. What's worse, this distributed modules design increase the project site installation precision. It is very difficult for the operators to install the modules. It needs much higher level operator to accomplish the installation.

Now the working thyristor elements upgrade very slowly, and most of them are not the up-date technology products. They have not been met the requirement of the direct current transmission and high capacity.

SUMMARY OF THE INVENTION

Preferred embodiments of the present invention seek to overcome above disadvantages of the prior design and provide a small size, light weight, easy assembly and maintenance novel thyristor valve module. This invention applies the up-date thyristor elements, such as thyristor valves, damped resistors, damped capacitors and so on, and adopts a kind special integration to realize the excellent function originally.

With this aim in view, the present invention resides in that a thyristor valve module, there are two same thyristor valve segments in the whole thyristor valve module; each segment includes saturated reactor, thyristor valve unit, direct current equalizing resistor unit, acquiring energy unit, damped resistor unit, damped capacitor unit, gate series unit and water cooling system; the thyristor valve unit, direct current equalizing resistor unit, acquiring energy unit, damped resistor unit, damped capacitor unit and gate series unit is fixed and connected together to form a thyristor valve string module; the saturated reactor itself constitutes a module; the thyristor valve unit is made up of several thyristor valves and its sub components series connection, there are coolers at both sides of each thyristor valve; according to the electricity design of the thyristor valve strings, each of them includes a damped resistor, a damped capacitor, direct current equalizing resistor, a acquiring resistor and gate series circuit; the arrangement of the thyristor valve string is centered as the thyristor valve unit, at both sides of the thyristor valve unit are arranged gate series unit and damped resistor, damped capacitor respectively; the thyristor valve string module and the saturated reactor module is series connected and consititute a thyristor valve segment.

Wherein the support structure of the thyristor valves module adopts bracket structure, the support bracket is made up of the aluminum alloy beam and the small section insulated beam to support the saturated reactor module and the thyristor valve string module; the support bracket includes five aluminum alloy beams and four insulated beams, and two of insulated beams are located the sides of the support bracket another two insulated beams are located the bottom of the support bracket; the thyristor valve module is separated into four parts by three interval aluminum alloy beams: two saturated reactor modules and two thyristor valve sting modules.

Wherein for each thyrisot valve string module, its thyristor valve unit, damped resistor unit, damped capacitor unit and gate series unit all adopt the modular design, and independent assemble; after assembling them, all of them are fixed on the thyristor valve module support bracket by the connectors and form the thyristor valve string module; each thyrisstor valve unit includes several thyristor valve stings; on both sides of each thyristor valve is pressed coolers; each thyristor valve string includes two direct current equalizing resistors and a acquiring energy resistor, all of them are installed on the same side of the thyristor valve coolers; the coolers cool not only the thyristor valves but also the acquiring energy resistors and the direct current equalizing resistors; it is beneficial to improving the performance of the acquiring resistors and the direct current equalizing resistors.

Said thyristor valve unit adopts precisely controlled liquid pressure mechanism to press together with certain pressure, and form a complete structure unit; the damped capacitor unit adopts 'U' small insulated beam and the high insulated plate to constitute the support structure, connects several damped capacitors of the thyristor valve string and integrated together to form a overall structure; the damped capacitors of the thyristor valve string are separated into two kinds: one is the three outlet wire terminals damped capacitor and another is two outlet wire terminals damped capacitor.

Wherein said damped resistor unit is constituted by several damped resistors and support brackets; the damped resistors are water cooling resistors;

Said gate series unit includes several gate series circuits which is fixed on high strength insulated plates; these gate series circuits is assembled a whole unit using a easy to swap fixation clamp; this fixation clamp is a long strip structure, on the side of the fixation clamp is a slide to install the circuit plate, on the bottom vertical to the side of the slide is a clip to fix the fixation clamp; there are two elastic decks about the clip; two elastic decks will change shape under certain pressure; on installing, insert the decks into the channel on the insulated plate directly to ensure well-fixed.

Wherein for the thyristor valve module elements material and the support material, the design considers the fire prevention problem; the fire prevention design includes two parts: the support structure insulated material of the thyristor valve module adopts good flam retardant materials; for the thyristor valve elements, damped resistors adopts direct water cooling system, the case of the damped resistors adopts the flame retardant material, the damped capacitors adopts the dry capacitor and flame retardant without oil design, the direct current equalizing voltage resistors and acquiring resistors all choose the modular thick resistors, the case of them all adopts the flame retardant materials.

Wherein said water cooling system includes one main inlet pipe and a main back let pipe, there are several branch pipes on the main inlet and back let pipe, the elements need to cool in the thyristor valve module is saturated reactor, thyristor valve cooler and the damped resistor, the whole water cooling path is parallel connection; between every two thyristor valve string elements, the cooling path is parallel connection, the inner of the thyristor valve string elements adopts the series connection, the cooling water first pass through branch pipe, thyristor valve cooler, then damped resistor, and back to the main back let pipe lastly; the water path of the saturated reactor is formed by the main back let pipe and the main inlet pipe series connection, so the water path of the saturated reactor is series connected with the main water path.

Wherein on the electricity circuit connection aspect, the saturated reactor of each thyristor valve segment is connected with the thyristor valve string elements through the soft connection mother string, and two segments are connected also through the soft connection mother string.

Wherein out of the thyristor valve module, there are many different length shields, the edges and corners of the shields adopt arc design, the shields is fixed on the support bracket of the thyristor valve module; the longer shields of them are located on the aluminum alloy beam near saturated reactor, the shorter shields are located on the insulated beam near the gate series unit.

In the present invention, the support structure of the thyristor valves module adopts bracket structure; the support bracket is made up of the aluminum alloy beam and the insulated beam to support two saturated reactor module and two thyristor valve string module. There are some advantages of the present invention compared with the prior module in the following:

(1) Firstly this design reduces the weight of thyristor valve module effectively and the size of the support structure;

(2) Secondly this structure overcomes the problems of metallic frame, such as large size, great weight and low space utilization, and also avoids the disadvantage of mixture frame which is constituted by the traditional metallic elements and the large section insulated beam, such as low strength, high manufacture cost and so on;

(3) Not only metallic frame structure but also metallic composition and large size insulated beam mixture frame structure have the load and stress concentration problems. This affects largely the overall strength. This invention adopts many aluminum alloy beam and insulated beam mixture structure design, this can distribute the load and reduce the stress concentration effectively.

DETAILED DESCRIPTION OF EMBODIMENTS

As FIG. 1-8 shown, for a thyristor valve string module, the gate series unit 02, damped resistor unit 04 and the damped capacitor unit 03 are located on two sides of the thyristor valve unit 01; considering the structure design, the center gravity of thyristor valve string module is little away from the geometric center. This is beneficial to the improving the force condition of the frame. For a segment the most weight saturated reactor module 05 and thyristor valve unit 01 is located the same axis, the center of gravity is near the geometric center of thyristor valve string module. This improves the force condition of the frame. For a thyristor valve string, the damped capacitor unit 03 is fixed near the damped resistor unit 04, this reduces the distance of the wire terminal of the damped capacitor 03 with the other electric elements, shorts the length of the wire of the thyristor valve string, improves the thyristor valve string electric performance. Gate series unit 02 is located near the thyristor valve unit. It is beneficial to controlling, trigging and protecting the thyristor valve.

Figure 1:
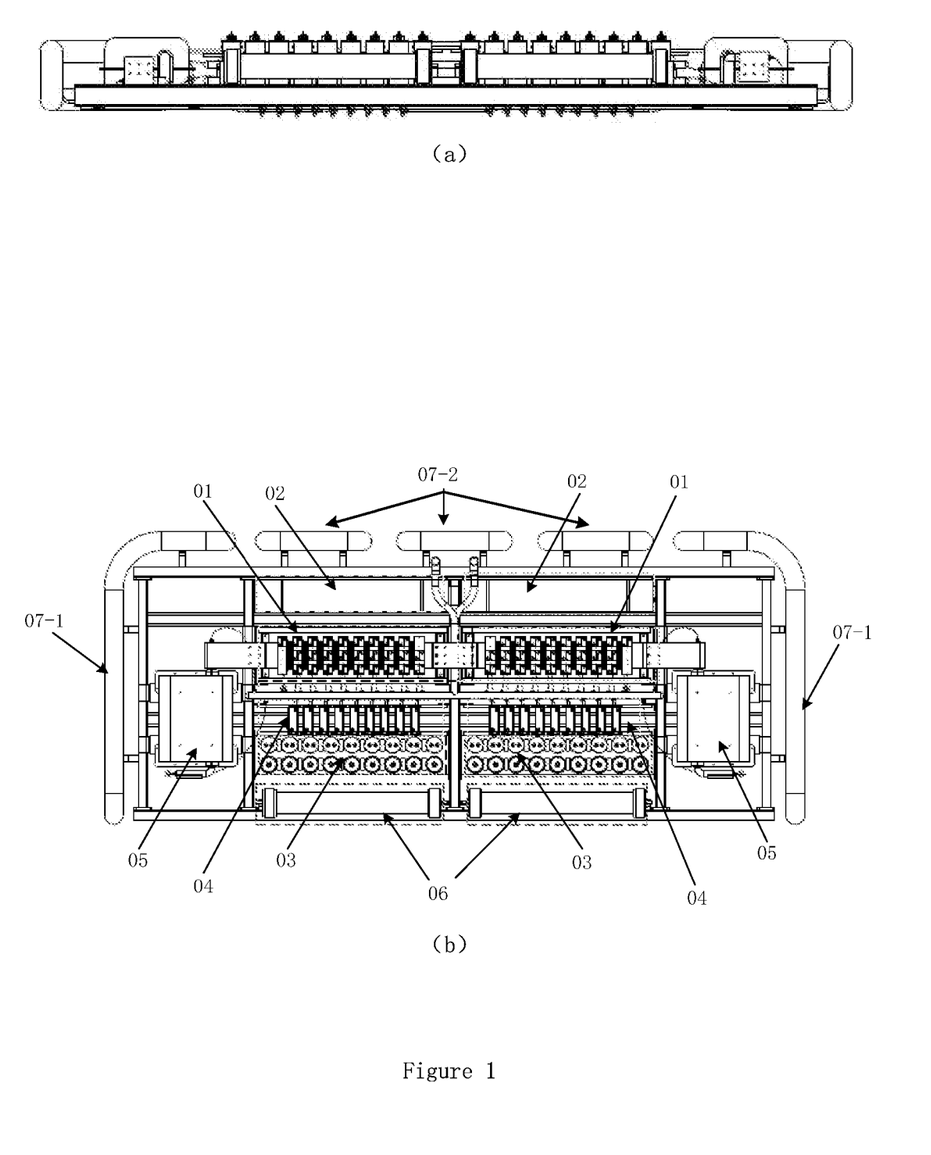
FIG. 1 is the overall structure schematic diagram of the present invention thyristor valve module.
Figure 2:
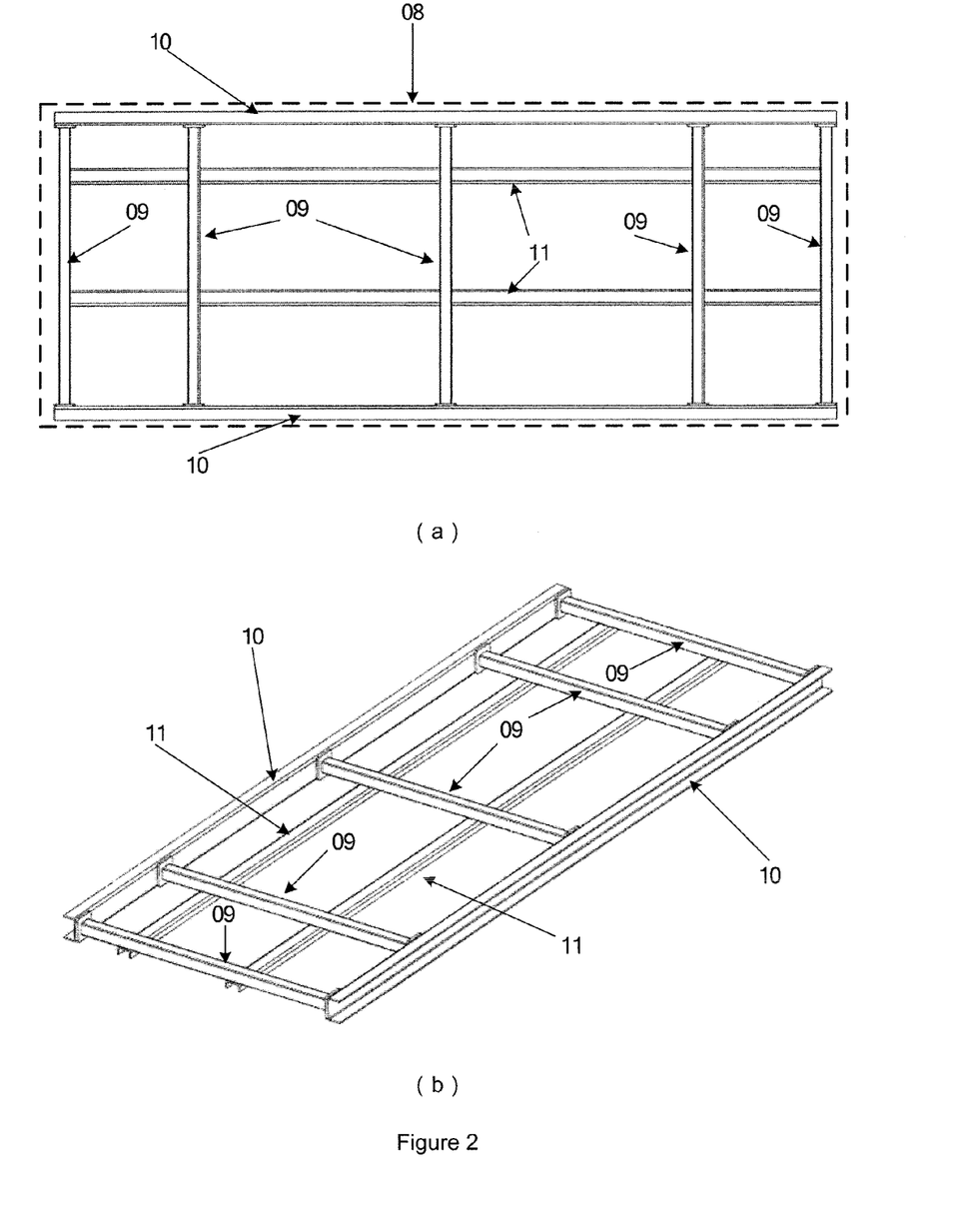
FIG. 2 is the segment structure schematic diagram of the present invention thyristor valve module.
Figure 3:
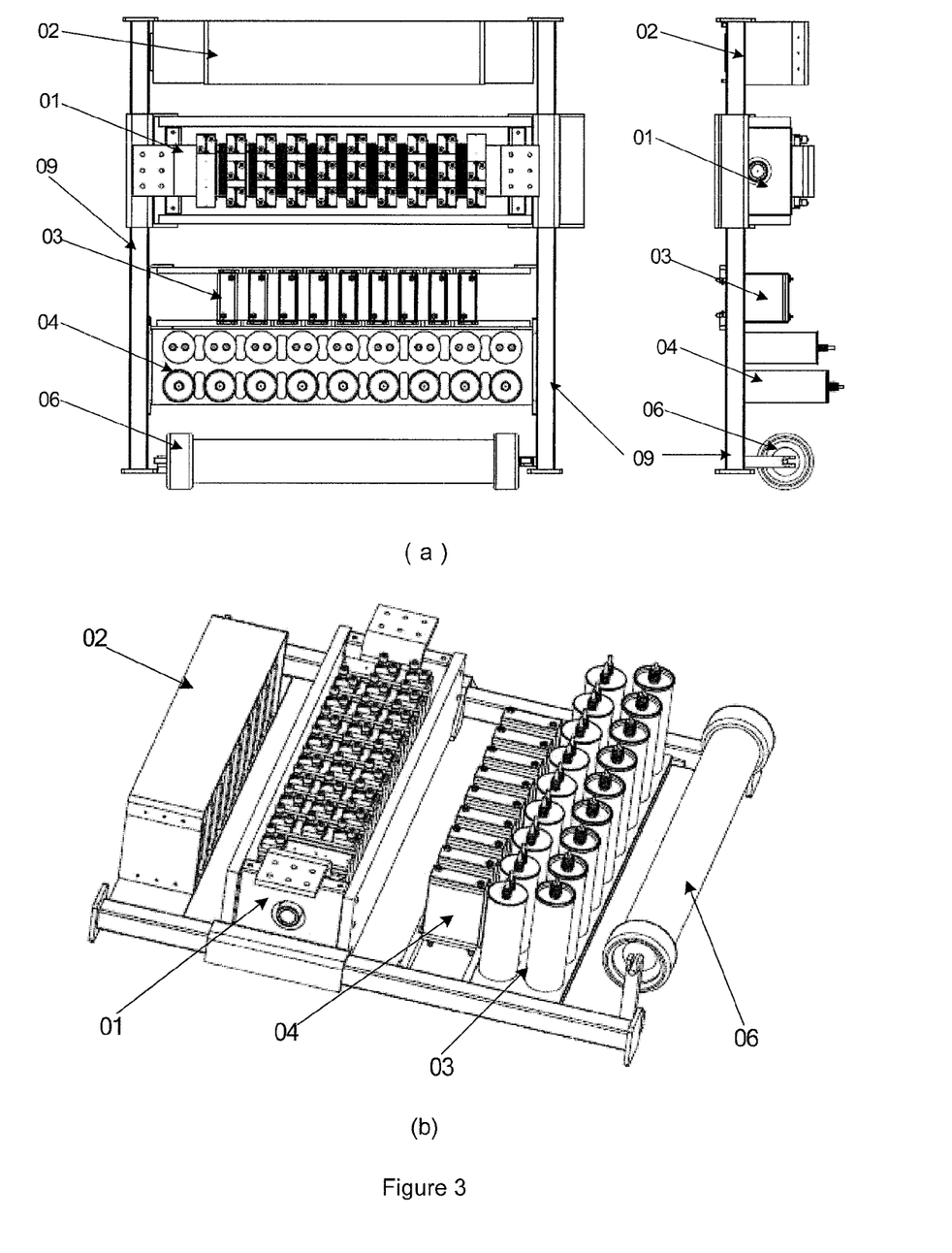
FIG. 3 the thyristor valve string elements structure schematic diagram of the present invention thyristor valve module.
Figure 4:
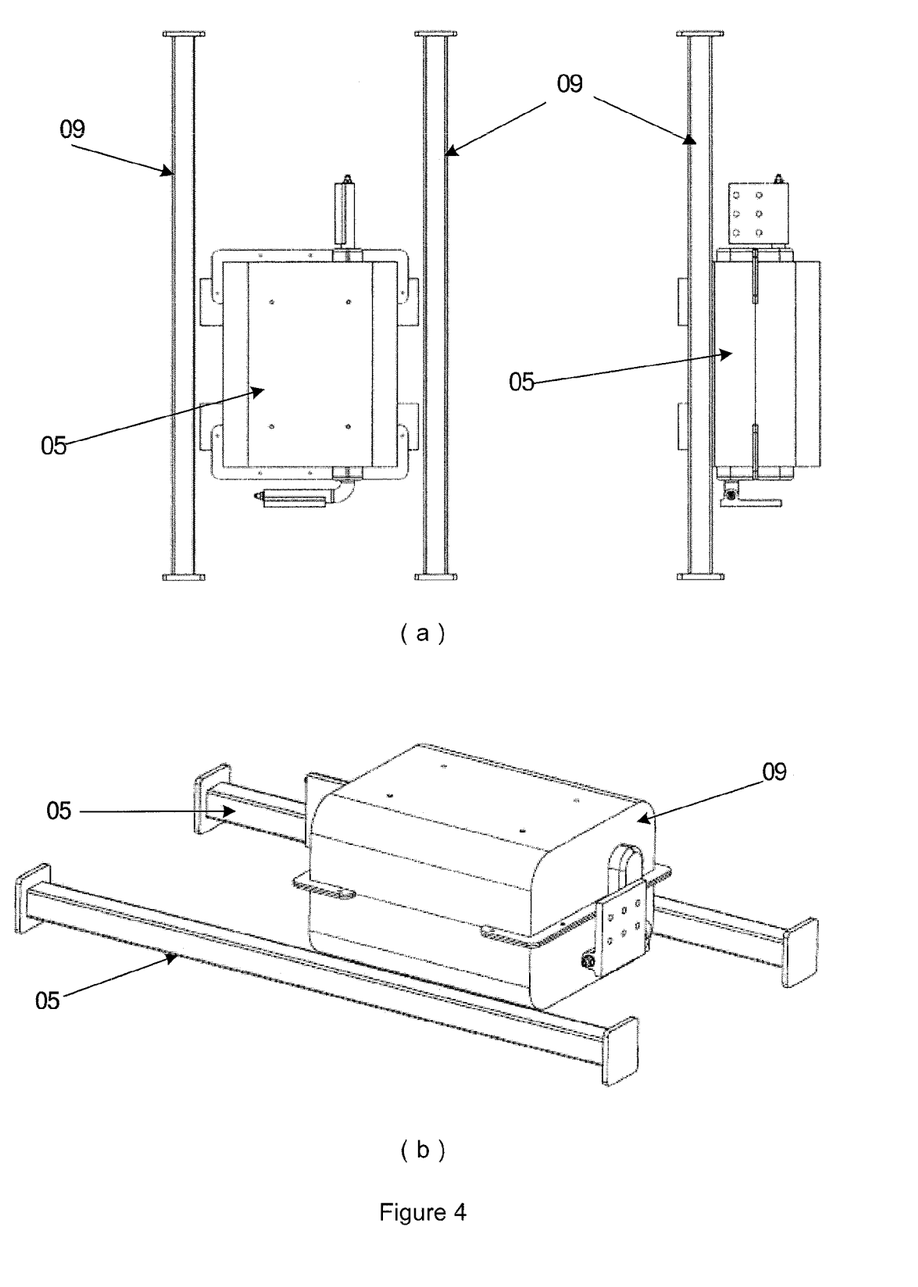
FIG. 4 is the saturated reactor elements structure schematic diagram of the present invention thyristor valve module.
Figure 5:
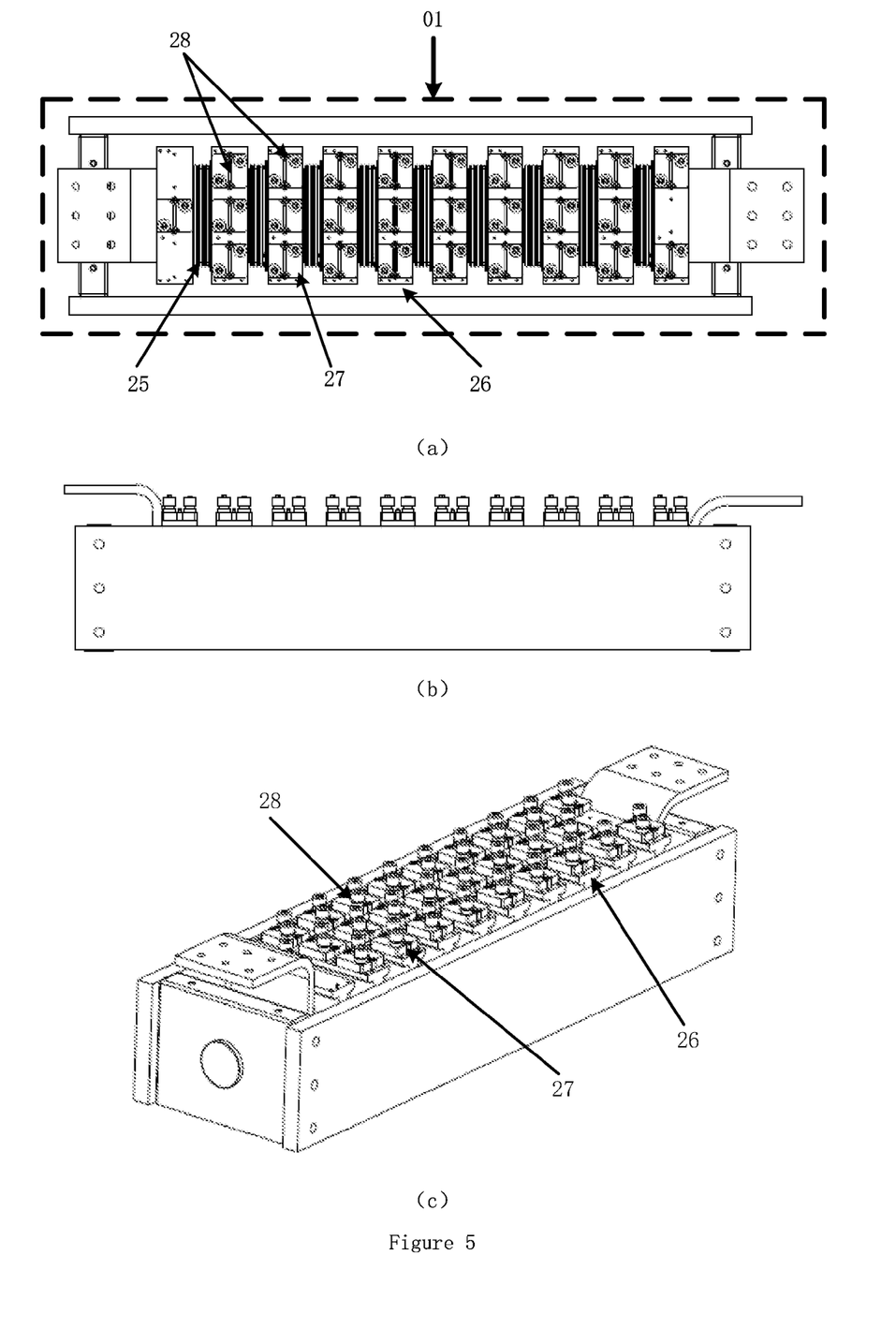
FIG. 5 is the thyristor valve unit structure schematic diagram of the present invention thyristor valve module.

On the electricity circuit connection aspect, the saturated reactor module 05 of each thyristor valve module is connected with the thyristor valve string elements through the soft connection mother string 29, and two segments are connected also through the soft connection mother string 30. This design can avoid damage because of the vibration of the thyristor valve during the operation. Further more, this can ensure long period reliability of the joint between mother strings, improve the safety of the thyristor valve.

On water cooling system design aspect, this invention adopts the parallel connection overall cooling system. This ensures the cooling effect consistence of all of the thyristor valve string elements, benefit to avoiding the performance difference of the elements because of different cooling temperature. On the pipe design, this invention adopts large inner diameter pipes because large inner diameter pipes and the parallel connection all over the water cooling system can effectively reduce the water pressure requirement to the water cooling system, avoid the water leakage of the pipe joints, increase the use life of the water cooling system, and improve the long period operation reliability of the thyristor valve.

Figure 6:
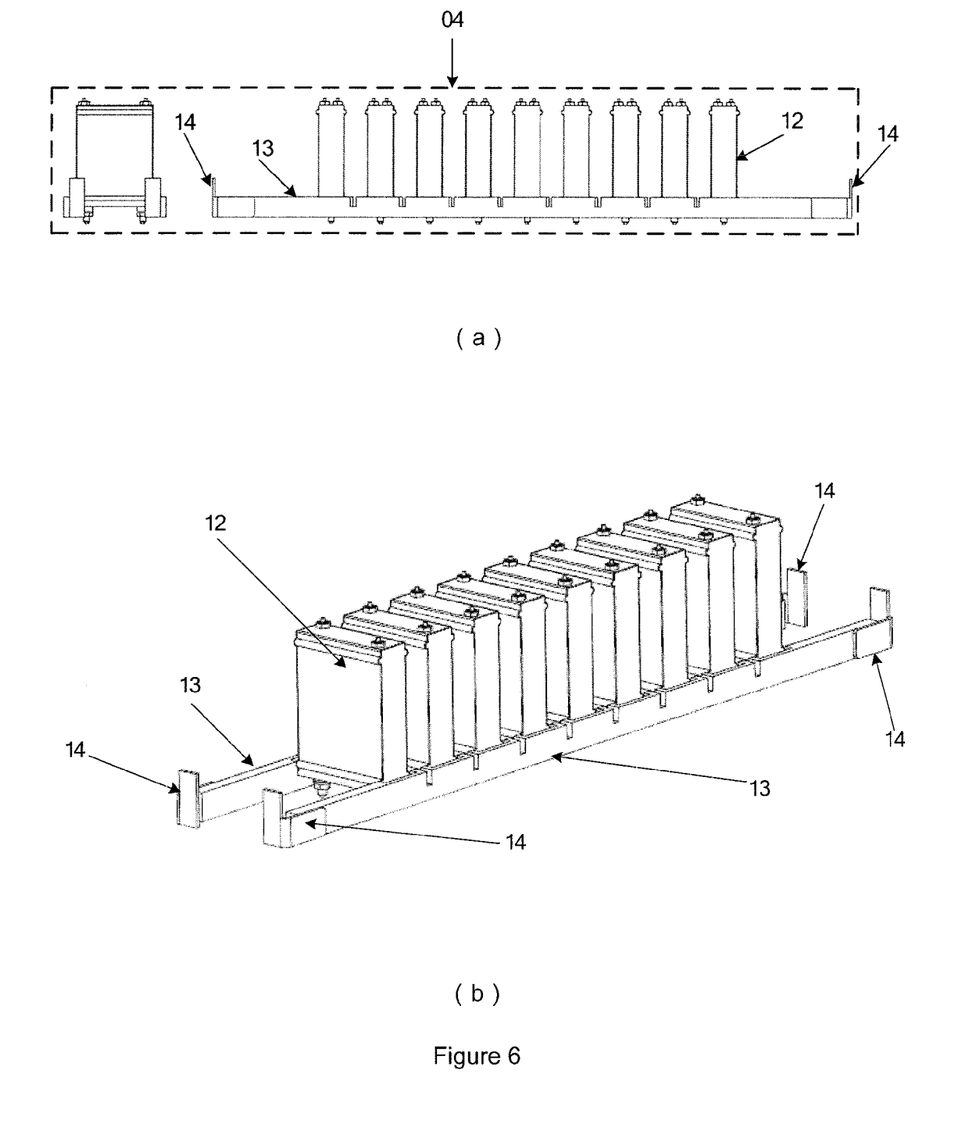
FIG. 6 is the damped resistor unit structure schematic diagram of the present invention thyristor valve module.

The damped resistor unit 04 adopts the small modular design; the case of damped resistor 12 adopts plastic. This reduces the geometry size of the thyristor valve module, lights the weight of the module, benefit to assemble them. On structure design of the damped resistor unit 04, it is supported by several damped resistors 12 and high strength insulated supporting beam 13. This ensures the structure strength of the damped resistor unit 04. The damped resistor unit 04 is fixed on the aluminum alloy beam 09 of the thyrsitor valves module frame 08 by the fixation corner casting 14.

Figure 7:
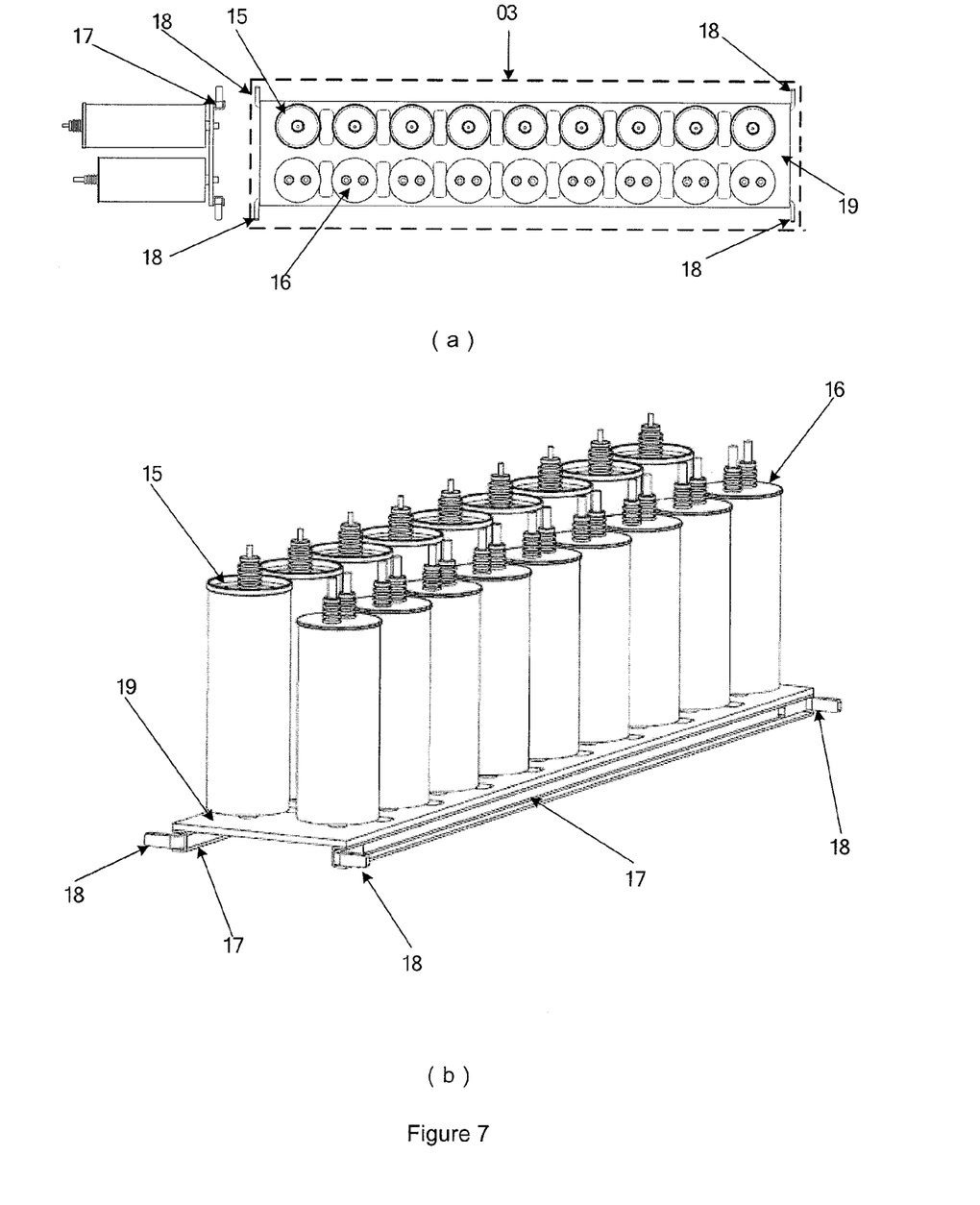
FIG. 7 is the damped capacitor unit structure schematic diagram of the present invention thyristor valve module.
Figure 8:
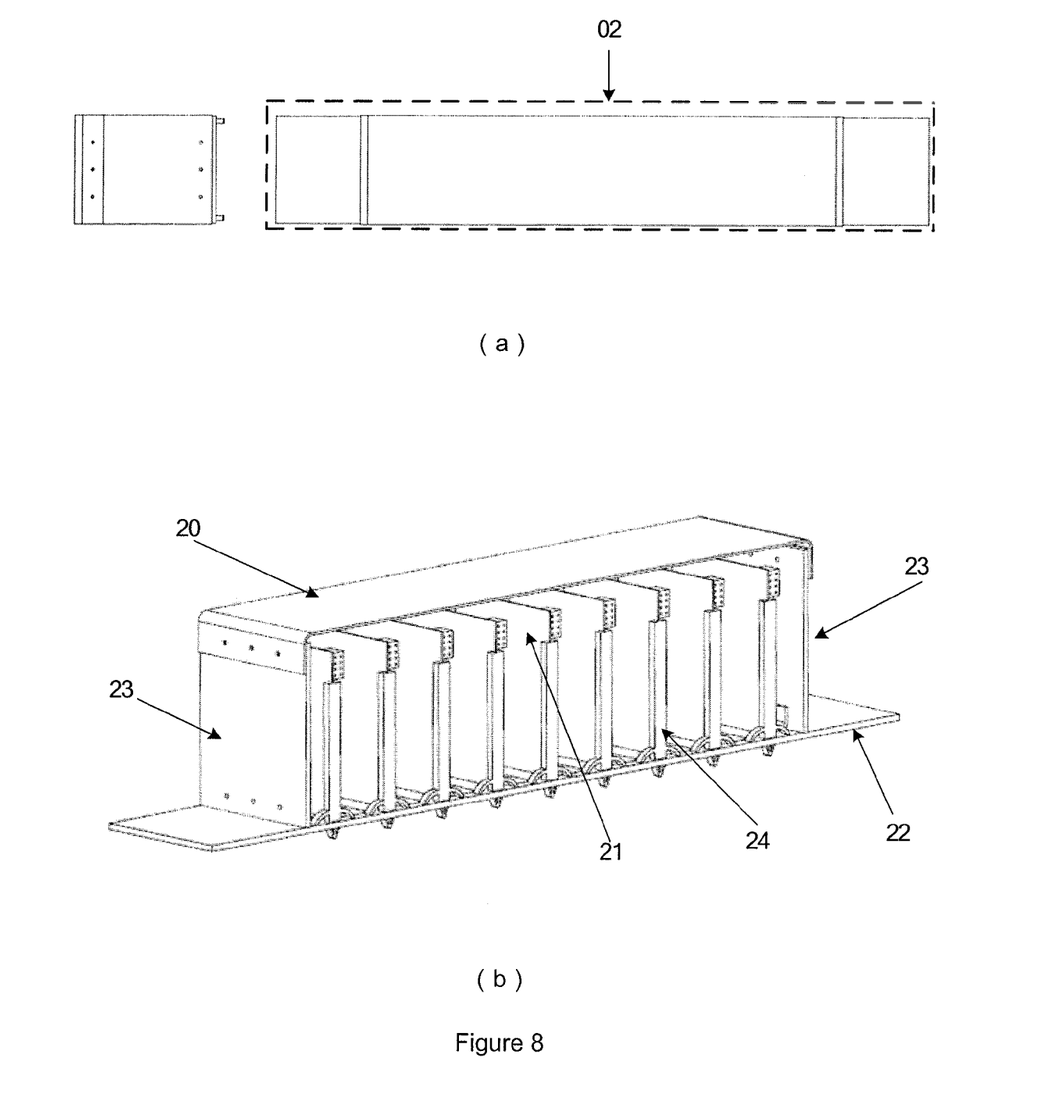
FIG. 8 is the gate series unit structure schematic diagram of the present invention thyristor valve module.

The damped capacitors of the thyristor valve string are separated into two kinds in the damped capacitor unit 03: one is the three outlet wire terminals damped capacitor 16 and another is two outlet wire terminals damped capacitor 15. Both the damped capacitor 15 and damped capacitor 16 are dry air capacitor. Because of its small volume and light weight, it is beneficial to installation and structure arrangement, reduces the size and weight of the module. On structure design, the damped capacitor unit 03 adopts several two ends damped capacitors 15 and three ends damped capacitors 16 fixing on the insulated plate 19. The insulate plate 19 is supported by the small section insulated beam 17. The damped capacitor unit is fixed on the aluminum alloy beam 09 of the module frame 08 through the aluminum alloy fixation climp 18.

Because the insulated materials and the case of the damped resistor 12 adopt the flame retardant materials, the two ends damped capacitor 15 and three ends damped capacitor 16 adopt dry air capacitor, the fire protection property is largely improved, the module have better flame retardant, the damage owing to fire can be reduced to least.

On the surface shield design, the invention adopts special design; it is the well equalizing pressure shield. This not only reforms the electric field distribute but also increases the technology aesthetics beauty. The shields are separated into two kinds: long shields 07-1 and short shield 07-2.

At last, in this description of the embodiments, we have detail describe the present invention according to a particular example. The detail embodiment is one example of the invention but not the only one, so the person in this field must be understand that all the alternatives and other equal and/or similar examples are all within the range of the invention and they are all consistent with the spirits of this invention, are all protected by our claims.

The invention claimed is:

1. A thyristor valve module, comprising two same thyristor valve segments in the whole thyristor valve module; each segment includes a saturated reactor, a thyristor valve unit, a direct current equalizing resistor unit, an acquiring energy unit, a damped resistor unit, a damped capacitor unit, a gate series unit and a water cooling system; the thyristor valve unit, the direct current equalizing resistor unit, the acquiring energy unit, the damped resistor unit, the damped capacitor unit and the gate series unit is fixed and connected together to form a thyristor valve string module; the saturated reactor itself constitutes a module; the thyristor valve unit is made up of several thyristor valves and its sub components have a series connection, there is a first cooler from the water cooling system at a side of each thyristor valve and a second cooler from the water cooling system at another side of each thyristor valve; according to an electrical structure of the thyristor valve strings, each of the thyristor valve strings includes a damped resistor, a damped capacitor, a direct current equalizing resistor, an acquiring resistor and a gate series circuit; the arrangement of the thyristor valve string is centered on the thyristor valve unit, the thyristor valve unit are arranged to have at both sides the gate series unit, the damped resistor and the damped capacitor respectively; the thyristor valve string module and the saturated reactor module are series connected and constitute the thyristor valve segment; and wherein a support structure of the thyristor valves module adopts a bracket structure, the support bracket is made up of an aluminum alloy beam and a small section insulated beam to support the saturated reactor module and the thyristor valve string module.

2. A thyristor valve module according to claim 1, wherein the support bracket includes five aluminum alloy beams and four insulated beams, and two of insulated beams are located the sides of the support bracket another two insulated beams are located the bottom of the support bracket; the thyristor valve module is separated into four parts by three interval aluminum alloy beams: two saturated reactor modules and two thyristor valve sting modules.

3. A thyristor valve module according to claims 2, wherein:
for each thyrisot valve string module, its thyristor valve unit, damped resistor unit, damped capacitor unit and gate series unit all adopt the modular design, and independent assemble; after assembling them, all of them are fixed on the thyristor valve module support bracket by the connectors and form the thyristor valve string module; each thyrisstor valve unit includes several thyristor valve stings; on both sides of each thyristor valve is pressed coolers; each thyristor valve string includes two direct current equalizing resistors and a acquiring energy resistor, all of them are installed on the same side of the thyristor valve coolers; the coolers cool not only the thyristor valves but also the acquiring energy resistors and the direct current equalizing resistors; it is beneficial to improving the performance of the acquiring resistors and the direct current equalizing resistors;
said thyristor valve unit adopts precisely controlled liquid pressure mechanism to press together with certain pressure, and form a complete structure unit; the damped capacitor unit adopts 'U' small insulated beam and the high insulated plate to constitute the support structure, connects several damped capacitors of the thyristor valve string and integrated together to form a overall structure; the damped capacitors of the thyristor valve string are separated into two kinds: one is the three outlet wire terminals damped capacitor and another is two outlet wire terminals damped capacitor.

4. A thyristor valve module according to claims 3, wherein:
said damped resistor unit is constituted by several damped resistors and support brackets; the damped resistors are water cooling resistors;
said gate series unit includes several gate series circuits which is fixed on high strength insulated plates; these gate series circuits is assembled a whole unit using a easy to swap fixation clamp; this fixation clamp is a long strip structure, on the side of the fixation clamp is a slide to install the circuit plate, on the bottom vertical to the side of the slide is a clip to fix the fixation clamp; there are two elastic decks about the clip; two elastic decks will change shape under certain pressure; on installing, insert the decks into the channel on the insulated plate directly to ensure well-fixed.

5. A thyristor valve module according to claims 4, wherein: for the thyristor valve module elements material and the support material, the design considers the fire prevention problem; the fire prevention design includes two parts: the support structure insulated material of the thyristor valve module adopts good flam retardant materials; for the thyristor valve elements, damped resistors adopts direct water cooling system, the case of the damped resistors adopts the flame retardant material, the damped capacitors adopts the dry capacitor and flame retardant without oil design, the direct current equalizing voltage resistors and acquiring resistors all choose the modular thick resistors, the case of them all adopts the flame retardant materials.

6. A thyristor valve module according to claims 5, wherein: said water cooling system includes one main inlet pipe and a main back let pipe, there are several branch pipes on the main inlet and back let pipe, the elements need to cool in the thyristor valve module is saturated reactor, thyristor valve cooler and the damped resistor, the whole water cooling path is parallel connection; between every two thyristor valve string elements, the cooling path is parallel connection, the inner of the thyristor valve string elements adopts the series connection, the cooling water first pass through branch pipe, thyristor valve cooler, then damped resistor, and back to the main back let pipe lastly; the water path of the saturated reactor is formed by the main back let pipe and the main inlet pipe series connection, so the water path of the saturated reactor is series connected with the main water path.

7. A thyristor valve module according to claim 6, wherein: on the electricity circuit connection aspect, the saturated reactor of each thyristor valve segment is connected with the thyristor valve string elements through the soft connection mother string, and two segments are connected also through the soft connection mother string.

8. A thyristor valve module according to claims 7, wherein: out of the thyristor valve module, there are many different length shields, the edges and corners of the shields adopt arc design, the shields is fixed on the support bracket of the thyristor valve module; the longer shields of them are located on the aluminum alloy beam near saturated reactor, the shorter shields are located on the insulated beam near the gate series unit.

* * * * *